United States Patent
Pourquier

(10) Patent No.: US 6,960,483 B2
(45) Date of Patent: Nov. 1, 2005

(54) METHOD FOR MAKING A COLOR IMAGE SENSOR WITH RECESSED CONTACT APERTURES PRIOR TO THINNING

(75) Inventor: Eric Pourquier, Voreppe (FR)

(73) Assignee: Atmel Grenoble S.A., Saint Egreve (FR)

(*) Notice: Subject to any disclaimer, the term of this patent is extended or adjusted under 35 U.S.C. 154(b) by 0 days.

(21) Appl. No.: 10/485,743
(22) PCT Filed: Aug. 30, 2002
(86) PCT No.: PCT/FR02/02979
§ 371 (c)(1),
(2), (4) Date: Feb. 4, 2004
(87) PCT Pub. No.: WO03/019669
PCT Pub. Date: Mar. 6, 2003

(65) Prior Publication Data
US 2005/0032265 A1 Feb. 10, 2005

(30) Foreign Application Priority Data
Aug. 31, 2001 (FR) .......................... 01 11336

(51) Int. Cl.⁷ .............................. H01L 21/00
(52) U.S. Cl. ........................................... 438/22
(58) Field of Search ................... 438/20, 22; 257/98

(56) References Cited

U.S. PATENT DOCUMENTS

| | | | |
|---|---|---|---|
| 5,144,747 A | 9/1992 | Eichelberger | |
| 5,250,843 A | 10/1993 | Eichelberger | |
| 6,646,289 B1 * | 11/2003 | Badehi | 257/81 |

FOREIGN PATENT DOCUMENTS

| | | |
|---|---|---|
| EP | 1 094 511 A | 4/2001 |
| WO | 99 40624 | 8/1999 |

OTHER PUBLICATIONS

Patent Abstract of Japan, vol. 007, No. 040 (E–159), Feb. 17, 1983 & JP 57 192052 A.

* cited by examiner

Primary Examiner—W. David Coleman
(74) Attorney, Agent, or Firm—Lowe Hauptman & Berner, LLP

(57) ABSTRACT

The invention relates to method for making a color image sensor. The method comprises:

the formation, on the front face of a semiconductive wafer (10), of a series of active zones (ZA) comprising image detection circuits and each corresponding to a respective image sensor, each active zone being surrounded by input/output pads (22), the transfer of the wafer by its front face against the front face of a temporary supporting substrate (20), the elimination of the major part of the thickness of the silicon wafer, leaving a fine silicon layer (30) on the substrate, this fine silicon layer comprising the image detection circuits.

Furthermore:

firstly, layers of color filters (18) are deposited and then etched on the semiconductive layer thus thinned, secondly, prior to the transfer of the semiconductive wafer to the substrate, on the front face of the wafer, metallized apertures (25) are formed extending to a greater depth than the elements of the image detection circuits formed on the surface of the wafer, and the step of elimination of the major part of the thickness of the semiconductive wafer includes the baring, from the rear, of the metallization (22) of the metallized apertures.

4 Claims, 2 Drawing Sheets

METHOD FOR MAKING A COLOR IMAGE SENSOR WITH RECESSED CONTACT APERTURES PRIOR TO THINNING

The invention relates to electronic image sensors, and especially to very small-sized sensors with dimensions that enable the making of miniature cameras such as those that are to be incorporated into a portable telephone.

Apart from great compactness, the image sensor should have high sensitivity under weak light and excellent colorimetrical performance.

Furthermore, the entire camera needs to be made by the most economical methods possible so as not to make the apparatus prohibitively costly.

To achieve this result, it is sought, firstly, to make the image sensor and the electronic processing circuits if possible on a same silicon substrate and, secondly, as far as possible, to carry out the deposition of the different layers, the etching operations, the heat-processing operations etc. collectively on a silicon wafer comprising many identical sensors, and then dice the wafer into individual sensors.

However, the methods hitherto proposed for making color image sensors and the structures of these sensors are not entirely satisfactory from this viewpoint. The methods of manufacture are not industrially efficient; they remain far too costly and their efficiency is far too low for large-scale manufacturing applications, or else the performance of the image sensor is not high enough.

The present invention proposes a method of manufacture and a corresponding image sensor that minimizes the costs of manufacture while presenting excellent quality and especially compactness, high sensitivity and high colorimetrical performance.

To this end, the invention propose a method for making an image sensor, comprising:

the formation, on the front face of a semiconductive wafer, of a series of active zones comprising image detection circuits and each corresponding to a respective image sensor, each active zone being surrounded by input/output pads, the transfer of the wafer by its front face against the front face of a temporary supporting substrate, the elimination of the major part of the thickness of the semiconductive wafer, leaving a very fine semiconductive layer comprising the image detection circuits on the substrate, this method being characterized in that:

firstly, layers of color filters are deposited and then etched on the semiconductive layer thus thinned, secondly, prior to the transfer of the semiconductive wafer to the substrate, on the front face of the wafer, metallized apertures are formed extending to a greater depth than the elements of the image detection circuits formed on the surface of the wafer, and the elimination of the major part of the thickness of the semiconductive wafer includes the baring, from the rear, of the metallization of the metallized apertures, and finally, the substrate is diced into individual sensors after the deposition and the etching of the color filters.

Preferably, the active zones comprise a matrix of photosensitive elements as well as control circuits of the matrix and associated image-processing circuits receiving signals coming from the photosensitive elements of the active area. The circuits thus associated with the matrix are preferably masked against light by a layer of aluminum, only the matrix being exposed to light.

The transfer of the semiconductive wafer to the temporary substrate can be done by gluing, classic soldering, anodic bonding or by simple molecular adhesion (i.e. through the very great force of contact between two surfaces having great planeity).

The thinning of the semiconductive wafer after transfer to the substrate and before the deposition of the filters can be done in many different ways: thinning by lapping, chemical thinning, a combination of both types of thinning (firstly mechanical thinning and then chemical finishing or else mechanical machining in the presence of chemicals). The thinning can also be done by a preliminary embrittlement of the wafer at the desired dicing level, in particular by in-depth hydrogen implantation in the desired dicing plane. In this case, the hydrogen implantation is done at a shallow depth in the semiconductive wafer before the transfer of the wafer to the substrate. The thinning is then done by heat processing which dissociates the wafer at the level of the implanted dicing plane, leaving a thin semiconductive layer in contact with the substrate.

The very great thinning of the wafer reduces its thickness from several hundreds of micrometers before transfer to the substrate to 3 to 20 micrometers after transfer to the substrate. Thinning is a major factor in the quality of the sensors since it enhances colorimetrical performance and sensitivity. With non-thinned sensors, illuminated by the side in which there are formed the numerous insulating and conductive layers that serve to define the image detection circuits, the light that has crossed a color filter is scattered on photosensitive dots corresponding to different colors, thus impairing colorimetrical performance. Furthermore, the sensitivity of a thinned sensor is improved because the photons reach a wider silicon region than in the case of the non-thinned sensors, since they are not stopped by the metal layers which are opaque and take up a large part of the surface area corresponding to each photosensitive dot.

It will be understood that the thinning, however, complicates the problems of manufacture because, after thinning, the silicon loses its rigidity and becomes very brittle, and that, furthermore, there arises the problem of connecting the image detection circuits with the exterior. The solution of the invention mitigates this difficulty and enables the making of the image sensors with great efficiency.

The connection pads of the sensors thus made are in the front of the substrate, on the side where the thinned silicon is located, the light being received from the same side for the formation of an image.

The substrate and the silicon layer are in close contact and the active circuit elements of the wafer are therefore well protected on this side.

Finally, on the thinned silicon layer, covered with color filters, it is possible to place either a transparent sheet or a passivation layer or again microlenses facing each sensor. These operations are preferably carried out on the substrate in wafer form, before it is diced into individual sensors.

For example, the thickness of the substrate is about 500 micrometers for a substrate with a diameter of 15 to 20 cm. The thickness of the silicon wafer is 500 to 1000 micrometers before thinning (with a diameter of 15 to 30 centimeters), and then 3 to 20 micrometers after thinning.

Planarization layers, made of polyimide for example, may be deposited on the silicon wafer before transfer to the intermediate substrate.

Other features and advantages of the invention shall appear from the following detailed description, made with reference to the appended drawings, of which:

FIG. 1 shows the general structure of a silicon wafer on which classic techniques have been used to make the image detection circuits of a multiplicity of image sensors.

The silicon wafer 10 has a thickness of several hundreds of micrometers, for a diameter of 150 to 300 millimeters.

Figure 1:
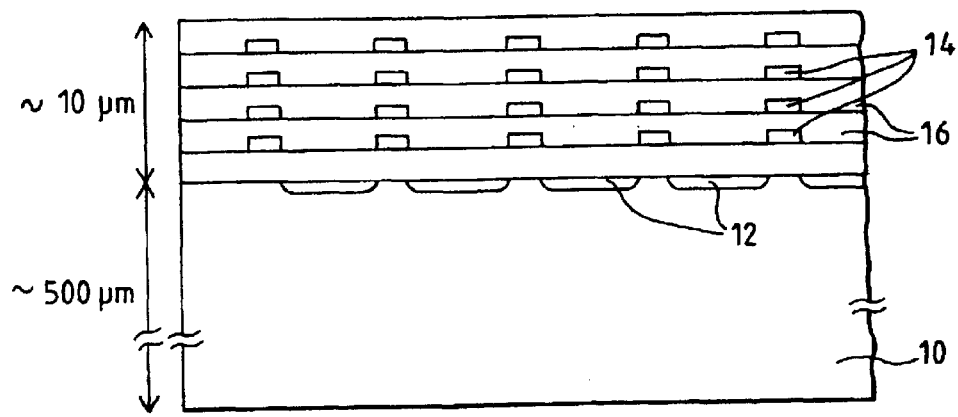
FIG. 1 shows the structure of an image sensor made on a silicon wafer before the positioning of color filters.

The image detection circuits (the matrix of photosensitive dots, transistors and interconnections) are fabricated on one face of the silicon wafer, which may be called the front face and is the upper face in FIG. 1. Fabrication implies, firstly, various operations of diffusion and implantation in the silicon, from the upper face of the wafer, to form especially photosensitive zones 12, and, secondly, successive operations for the deposition and etching of conductive layers 14 and insulating layers 16 forming a stack on top of the photosensitive zones 12. The insulating and conductive layers form part of the image detection circuits and enable the collection of electrical charges generated in the photosensitive zones by an image projected on the sensor.

If the sensor were to be made by means of a classic technology, then a mosaic of color filters would be deposited on the surface of the wafer. According to the invention, they are not deposited at this stage and preliminary operations are performed.

For each individual image sensor formed on the silicon wafer, input/output pads surround an active surface comprising both a matrix of photosensitive zones and associated electronic circuits.

These input output pads (22 in FIG. 2) are connected to the conductive layers 14 and, in the present invention, are formed as follows: apertures 25 are hollowed out in the stack of insulating layers 16 as well as in the depth of the silicon substrate. The depth of the apertures 25 is greater than the depth of all the image detection circuits (photosensitive zones, interconnections, etc.) formed in the silicon wafer. This depth corresponds more or less to the silicon thickness that will remain after the subsequent thinning of the silicon and will contain these image detection circuits.

The thinning of the silicon, which will be done by the rear of the wafer, will in principle reach exactly the bottom of the apertures 25. However, it will be seen that the depth of the apertures 25 may be slightly different from the desired thickness for the thinned silicon. Typically, the depth of the apertures 25 is about 5 to 20 microns inside the silicon of the wafer, namely about 15 to 30 micrometers below the surface of the stack of conductors and insulating layers 14, 16.

In the apertures 25, there is preferably formed firstly an insulating layer 26. Then a metal layer is deposited and etched. This metal layer will form the connection pads 22. These connection pads come into contact with one of the conductive layers 14. If, for this purpose, it is necessary to make apertures for the local baring of a layer 14, the insulating layers 16 which cover the layer 14 are hollowed out locally before the deposition of the metal layer in the aperture 25.

Figure 3:
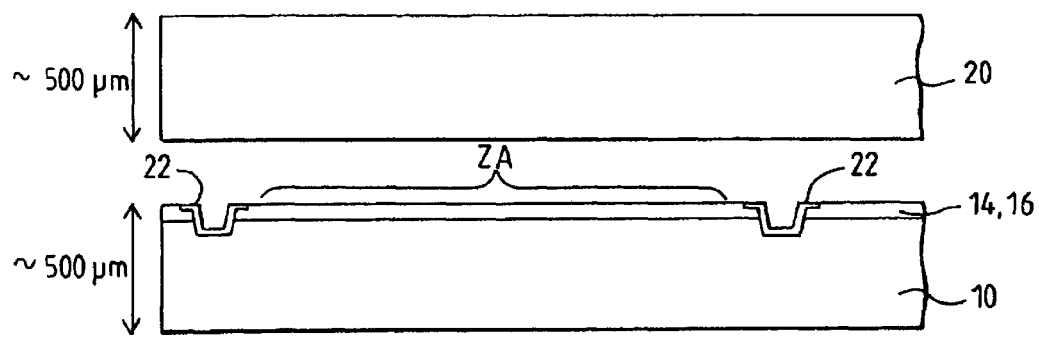
FIG. 3 shows the operation of transfer of the silicon wafer by its front face to a supporting substrate.

No color filters are deposited at this stage but the wafer is transferred by its front face to a temporary substrate 20 (FIG. 3). The substrate is a wafer having the same diameter as the wafer 10 and a similar thickness to ensure the rigidity of the structure while it is being made. It may furthermore be constituted by another silicon wafer. The transfer can be done after the deposition of a planarization layer serving to fill the relief features created on the front face of the silicon wafer by the operations of deposition and etching of the stack of conductive and insulating layers. This planarization layer does not need to be transparent FIG. 3 represents the structure on a smaller scale than that of FIG. 1 in order to show the entire individual sensor comprising an active zone ZA and connection pads 22 around the active zone ZA.

The transfer of the silicon wafer to the supporting wafer 20 can be done by several means. The simplest means could be quite simply that of holding the wafer by molecular adhesion, since the great planeity of the surfaces in contact generates very high contact forces. Gluing is also possible. It is also possible to carry out a soldering by means of the connection pads 22 and corresponding pads formed beforehand in the substrate 20. In this case, it can furthermore be envisaged that the substrate 20 will comprise auxiliary active or passive circuit elements, that are connected to these pads and are therefore capable of being directly connected to the image sensor.

After the silicon wafer has been transferred by the front face to the supporting wafer, the major part of the thickness of the silicon wafer 10 is eliminated so as to leave only a thickness of about 8 to 30 micrometers, including the thickness of the stack of layers. What remains of the silicon wafer is no more than a superimposition of a few micrometers (for example about ten micrometers) for the stack of layers 14, 16 and about three to 20 micrometers for the remaining silicon thickness, including the photosensitive areas 12. The remaining thickness is that of the layer 30 of FIG. 3 containing the photosensitive zones 12 of FIG. 1.

Figure 4:
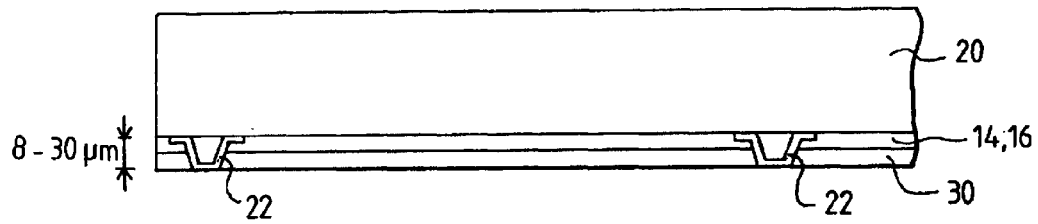
FIG. 4 shows the supporting substrate with the silicon wafer after thinning of the wafer.
Figure 5:
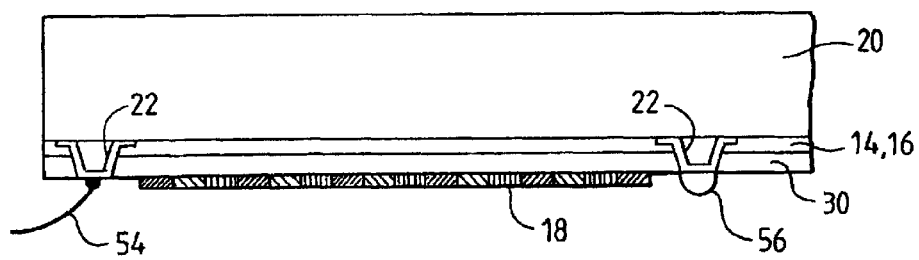
FIG. 5 shows the substrate, bearing a thinned silicon layer on which a mosaic of color filters has been deposited.

The thinning reveals the metallization of the connection pads 22 so that they become electrically accessible by the rear face of the silicon wafer (the front face being the upper face in FIG. 1, pointing upwards and covered with the substrate 20 in FIGS. 4 and 5).

If the thinning goes slightly beyond the deepest part of the metallization, it must allow a part of this metallization to remain in order to make access possible. If the thinning is slightly short (by a few micrometers) of the deepest part of metallization, it is possible to envisage the subsequent opening of access apertures through the rear face of the thinned silicon, these apertures baring the metallizations 22.

The thinning operation can be done by mechanical machining (lapping) terminated by chemical machining, or by chemical machining only, or by mechanical machining in the presence of chemicals or again by a particular method of separation necessitating a preliminary implantation of an embrittling impurity in the plane that will demarcate the thinned silicon layer.

In the case of this separation by implantation of impurities, the implantation must be done before the transfer of the silicon wafer to the supporting wafer. Indeed, the implantation is done by the front face of the silicon wafer, throughout the surface of the wafer and at a depth that will define the dicing plane. The preliminary implantation is preferably hydrogen implantation. It can be done at various stages of the making of the wafer, but the separation of the thickness of the wafer along the implanted dicing plane can be done only when the silicon wafer has been attached to the supporting wafer.

Figure 2:
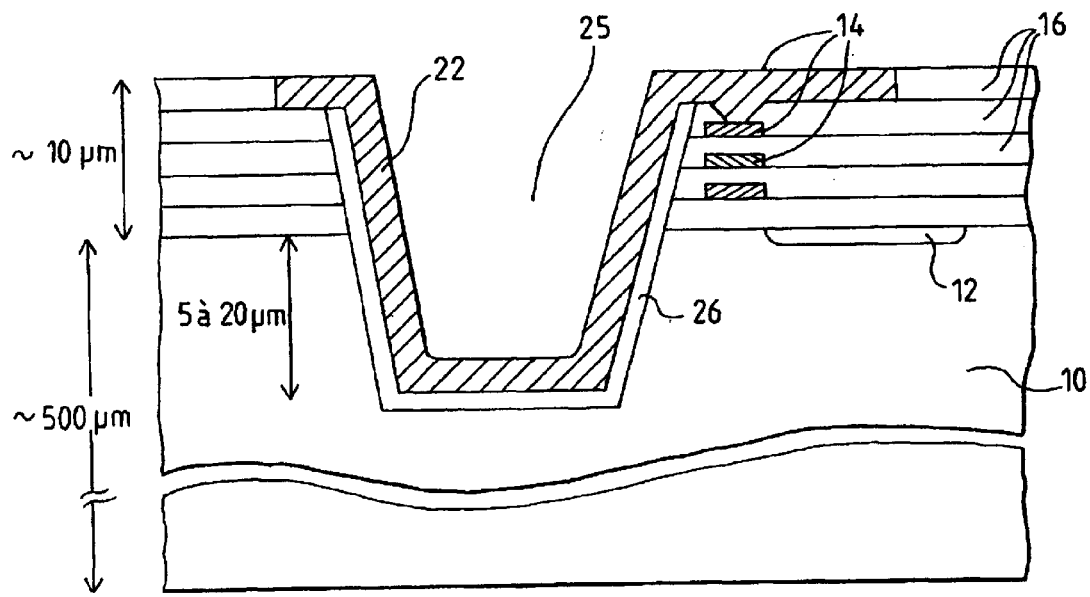
FIG. 2 shows the formation on this wafer of apertures filled with a metallization layer.

The upper surface of the thinned silicon layer 30 can be processed (fine lapping, chemical cleaning, mechanical/chemical polishing, etc.) in order to eliminate the surface defects, leading to a multiple-sensor wafer whose general structure is that of FIG. 2.

A mosaic of color filters 18 is then deposited on the surface of the layer 30 (FIG. 4). However, one or more additional layers can be deposited before the deposition of the color filters, especially passivation layers, anti-reflection layers and other layers, electrical activation layers etc.

A glass film, or an individual lens for the image sensor, or a matrix of microlenses having the same spacing pitch as the color filters 18 may be deposited on the rear face (the face to be illuminated) of the structure after the deposition and etching of the color filters.

The connection pads that have been bared by the thinning operation may be used for a "wire-bonding" type connection (the wires 54 being soldered to the pads) or a "flip-chip" type of connection (the chip being placed upside down with the connection pads against the corresponding pads of the printed circuit board with intermediate conductive bosses 56). In this case, the sensor is illuminated through the top of the printed circuit board and the board must have an aperture facing the photosensitive matrix.

In these different embodiments, the structure formed on the substrate 40 may be tested on the wafer by means of the connection pads. The test may be performed in the presence of light, image patterns, etc.

The structure is diced into individual sensors for packaging only at the end of this fabrication process.

What is claimed is:

1. A method for making an image sensor, comprising the steps of:

forming, on the front face of a semiconductive wafer, of a series of active zones comprising image detection circuits and each corresponding to a respective image sensor, each active zone being surrounded by input/output pads;

transferring of the wafer by its front face against the front face of a temporary supporting substrate;

eliminating of the major part of the thickness of the silicon wafer, leaving a fine silicon layer on the substrate, this fine silicon layer comprising the image detection circuits, depositing, layers of color filters and then etching on the semiconductive layer thus thinned, prior to the transfer of the semiconductive wafer to the substrate, on the front face of the wafer, metallized apertures are formed extending to a greater depth than the elements of the image detection circuits formed on the surface of the wafer, eliminating the major part of the thickness of the semiconductive wafer includes the baring, from the rear, of the metallization of the metallized apertures, dicing, the substrate into individual sensors after the deposition and the etching of the color filters.

2. The method according to claim 1, wherein the remaining thickness of the thinned semiconductive layer is about 3 to 20 micrometers.

3. The method according to claim 1, wherein a sheet of transparent material is placed on the thinned semiconductive layer covered with color filters.

4. The method according to claim 2, wherein a sheet of transparent material is placed on the thinned semiconductive layer covered with color filters.

* * * * *